United States Patent [19]
Okamoto et al.

[11] Patent Number: 5,502,693
[45] Date of Patent: Mar. 26, 1996

[54] MAGNETIC RECORDING SYSTEM FOR COMPENSATING LEAKAGE FLUX

[75] Inventors: Ricardo M. Okamoto; Kouichi Matsumoto; Isao Kotani; Satoshi Kuroda; Hiroyuki Ishikawa; Kenji Fukui, all of Tokyo, Japan

[73] Assignee: Nippon Steel Corporation, Tokyo, Japan

[21] Appl. No.: 214,478

[22] Filed: Mar. 17, 1994

[30]      Foreign Application Priority Data

Mar. 18, 1993   [JP]   Japan ................................... 5-085607

[51] Int. Cl.⁶ .................................................. G11B 11/00
[52] U.S. Cl. ................................. 369/13; 360/114
[58] Field of Search ................... 369/13, 44. 13, 369/44.14, 44.11, 59, 116, 114; 360/59, 114, 46, 110, 123, 125, 128, 135; 365/122

[56]            References Cited
U.S. PATENT DOCUMENTS

| 4,937,801 | 6/1990 | Miura et al. | 369/13 |
| 5,303,212 | 4/1994 | Sugiyama | 369/13 |

FOREIGN PATENT DOCUMENTS 4-205941   7/1992   Japan .

*Primary Examiner*—Ali Neyzari
*Attorney, Agent, or Firm*—Pennie & Edmonds

[57]                ABSTRACT

A magnetic recording system having a magnetic head and a magnetic-field generating device including a compensation circuit for supplying a current generating a magnetic field to cancel a leakage magnetic field applied to the magnetic recording medium, the leakage field arising from at least one of an actuator magnetically driven to drive the magnetic head and an actuator magnetically driven to focus and track a laser beam on the magneto-optical disk.

8 Claims, 8 Drawing Sheets

MAGNETIC-FIELD
MODULATION SYSTEM

MAGNETIC RECORDING SYSTEM FOR COMPENSATING LEAKAGE FLUX

BACKGROUND OF THE INVENTION

1. Field of the Invention

The present invention relates to a magnetic recording system having a magnetic field generation structure for eliminating influences of external magnetic fields operation.

2. Description of the Related Art

The prior art discloses types of magneto-optical disk systems designed to obtain a high recording density. FIG. 1 shows a typical example of such a magneto-optical disk system and will be used to describe the present invention.

In FIG. 1, the illustrated magneto-optical disk system includes a laser-beam irradiation means for irradiating a light beam onto a magneto-optical disk 5 and a magnetic field generation means for applying a magnetic field to the magneto-optical disk 5. The laser-beam irradiation means, which has a semiconductor laser 1, a collimating lens 2, a beam splitter 3 and an objective lens 4, acts to converge the light emitted from the semiconductor laser 1 into a magnetic recording layer of the magneto-optical disk 5 through the collimating lens 2, beam splitter 3 and objective lens 4. Further, the magnetic-field generation means, which has a magnetic head 6 and a magnetic head drive circuit 7, functions to selectively apply the magnetic field to the magnetic recording layer of the magneto-optical disk 5. A recording magnetic field and an erasing magnetic field are modulated in a manner according to the storage system, which, for purposes of this description, is either an optical modulation system or a magnetic-field modulation system.

In the optical modulation system, in a record mode, a laser beam is irradiated from a laser-beam irradiation means and irradiated in the form of a spot with an intensity based on information to be recorded, while a constant magnetic field is applied in one direction by a magnetic-field generation means to the magnetic head 6. In an erase mode, a laser beam with a constant intensity is irradiated from the laser-beam with a constant intensity is irradiated from the laser-beam irradiation means while a magnetic field opposed in direction to the record mode is applied by the magnetic-field generation means to the magnetic head.

In the magnetic-field modulation system, on the other hand, in a record mode, a laser beam issued from a laser-beam irradiation means is irradiated with a constant intensity while a modulated magnetic field according to information to be recorded is applied by a magnetic-field generation means via the magnetic head 6. In an erase mode, a laser beam with a constant intensity is irradiated from the laser-beam irradiation means while a constant magnetic field is applied by the magnetic-field generation means.

In the case of both of the optical and magnetic-field modulation systems, a reproduction mode is conducted in substantially the same manner. Namely, only the laser beam irradiated from the laser-beam irradiation means is irradiated on the magneto-optical disk so that, when the system detects the degree of polarization of light reflected by the magneto-optical disk, the associated recorded information can be read.

In either system, however, in order to achieve accurate data recording/reproduction, the laser beam must be converged into the magnetic recording layer of the magneto-optical disk. Concurrently, the converged laser beam must be precisely kept at a desired track of the layer. Accordingly, the objective lens 4 is usually mounted on a focusing/tracking actuator 4a. The actuator can be a shaft rotation type or a wire support type and generally comprises a fixed permanent magnet and a coil to utilize repulsion and attraction forces there-between.

For the purpose of securing a certain level of response performance of the above focusing/tracking actuator 4a, it is desirable that the permanent magnet generates a certain intensity of magnetic field. However, the magnetic field derived from the permanent magnet may affect the magnetic recording layer of the magneto-optical disk and further the magnetic head, and as a leakage magnetic field, have a detrimental effect on the magnetic field generated by the magnetic head. The effect will be explained in more detail below. Specifically, the above effect when the direction of the magnetic field generated by the magnetic head is pointed in a direction away from the magneto-optical disk as shown in FIG. 2A is different from the effect when the direction of the field of the magnetic head is pointed in a direction toward the magneto-optical disk as shown in FIG. 2B. For this reason, it has been difficult to apply a desirable magnetic field to the magneto-optical disk because of an off-set in waveform of the magnetic field intensity as shown in FIG. 2C.

Further, since many of the commonly used actuators, such as linear motors or voice coil motors, for driving the magnetic head to a target track position are driven based on magnetic reaction, the magnetic field itself generated by the actuator also acts as an undesired external magnetic field for the magneto-optical disk.

In addition, an actuator such as a linear motor or a voice coil motor for moving the laser-beam irradiation means to the target track similarly generates an external magnetic field that is undesired for the magneto-optical disk.

In a magneto-optical disk system of a magnetic-field modulation type, a laser beam is irradiated from an optical pickup head, a modulated magnetic field is applied from the magnetic head at the same time when a coercive force of a recording medium is released, so that the magnetizing direction of the recording medium is determined and data recording and erasing is carried out.

An objective lens for the optical pickup head is carried by a focusing or tracking actuator which consists of an electromagnet and a permanent magnet so that a focused position coincides with a recording track position. However, when recording data, a leakage magnetic field mainly caused by a leakage flux from the permanent magnet is added to the applied magnetic field of the magnetic head on the recording medium, which prevents the intensity of recording or erasing magnetic field from being applied sufficiently in one direction.

In this connection, the external magnetic-field generation sources include the permanent magnet of the focusing or tracking actuator, linear motors in the seeking parts and a spindle motor, and a clamper for mounting of the magneto-optical disk to the spindle motor.

For the purpose of shielding such leakage magnetic field derived from the tracking, focusing actuators as mentioned above, it is considered to provide a magnetic shield to the actuators. However, since the magnetic shield is relatively heavy, i.e., since this means that the weight of a movable part for seeking of a target recording track is increased, its seek time becomes long and further a cost is undesirably increased by the movable shield. Kusano discloses in JP-A-4-205941 a magnetic head which is additionally provided with a coil for canceling the influences of leakage magnetic field. Even in this case, however, the weight and manufacturing cost of the magnetic head part is increased. Furthermore, Kusano's magnetic head has a narrower area of effective magnetic field available for a writing or a reading operation because the head furnishes aside with the compensating electro-magnetic transducer from the main magnetic head. That is, the compensating [coil] electro-magnetic transducer generates a compensating magnetic field having a trailing distribution with a peak shifted from the center of the effective magnetic field generated from the main magnetic head. The above-mentioned shifted compensating magnetic field generated from the main magnetic head. The above-mentioned shifted compensating magnetic field derives a skewed distribution of an effective area of the magnetic field for writing and reading signals on and from the magnetic medium. Thus Kusano's magnetic head requires a stronger driving force to obtain a sufficient strength of the magnetic field for proper operations.

SUMMARY OF THE INVENTION

In view of the above problems in the prior art, the object of the present invention is to provide a magnetic recording system which can eliminate the influences of a magnetic field leaked from an objective lens actuator, etc. on a recording magnetic field generated by a magnetic head while eliminating the need for a magnetic shield or an additional compensating coil.

An object of the present invention is to provide sufficient recording/erasing magnetic field in both direction prevented from being applied in one direction due to addition of the leakage magnetic field generated by the focusing or tracking actuator, linear motors in the seeking parts, the spindle motors, and the clamper for mounting of the magneto-optical disk to the spindle motor.

The above object is attained, by adding an offset direct electric current to the magnetic head drive electric current supplied to the coil of the magnetic head from the magnetic head drive circuit.

In accordance with one aspect of the present invention, the above object is attained by a magnetic recording system which comprises magnetic-field generation means for causing a magnetic field generated by a magnetic head to record/erase data on/from a recording medium, and wherein the magnetic-field generation means has a compensation circuit for compensating for external magnetic field adversely influencing the medium. In particular, it is desirable that the medium be an magneto-optical disk and that the compensation circuit controls the magnetic head to compensate the external magnetic field generated by at least one of a magnetic driven actuator for driving of the magnetic head, a magnetic driven actuator for driving of a laser-beam irradiation means for irradiating a laser beam from a light source onto the magneto-optical disk, and a magnetic driven actuator for focusing of the laser beam from the laser-beam irradiation means on the magneto-optical disk and for tracking a recording track, a clamper and a spindle motor.

Reversal of the magnetic field of the magnetic head is carried out by a magnetic head drive circuit for controlling an electric current flowing through the magnetic head. Accordingly, in the case where the direction of the external magnetic field is previously known, when the magnetic head generates a magnetic field in a direction opposite to the external magnetic field, the electric current through the electro-magnetic transducer may be increased to prevent from weakening the writing intensity of the magnetic field.

Further, when the magnetic head generates a magnetic field in the same direction as the external magnetic field, the influences of the external magnetic field on the medium to a large extent can be eliminated by decreasing the electric current through the electro-magnetic transducer.

In addition, in accordance with the present invention, it is not required to provide the magnetic head with an additional coil for canceling undesired external magnetic fields.

DESCRIPTION OF THE PREFERRED EMBODIMENTS

The present invention will be described with reference to the attached drawings.

Figure 1:
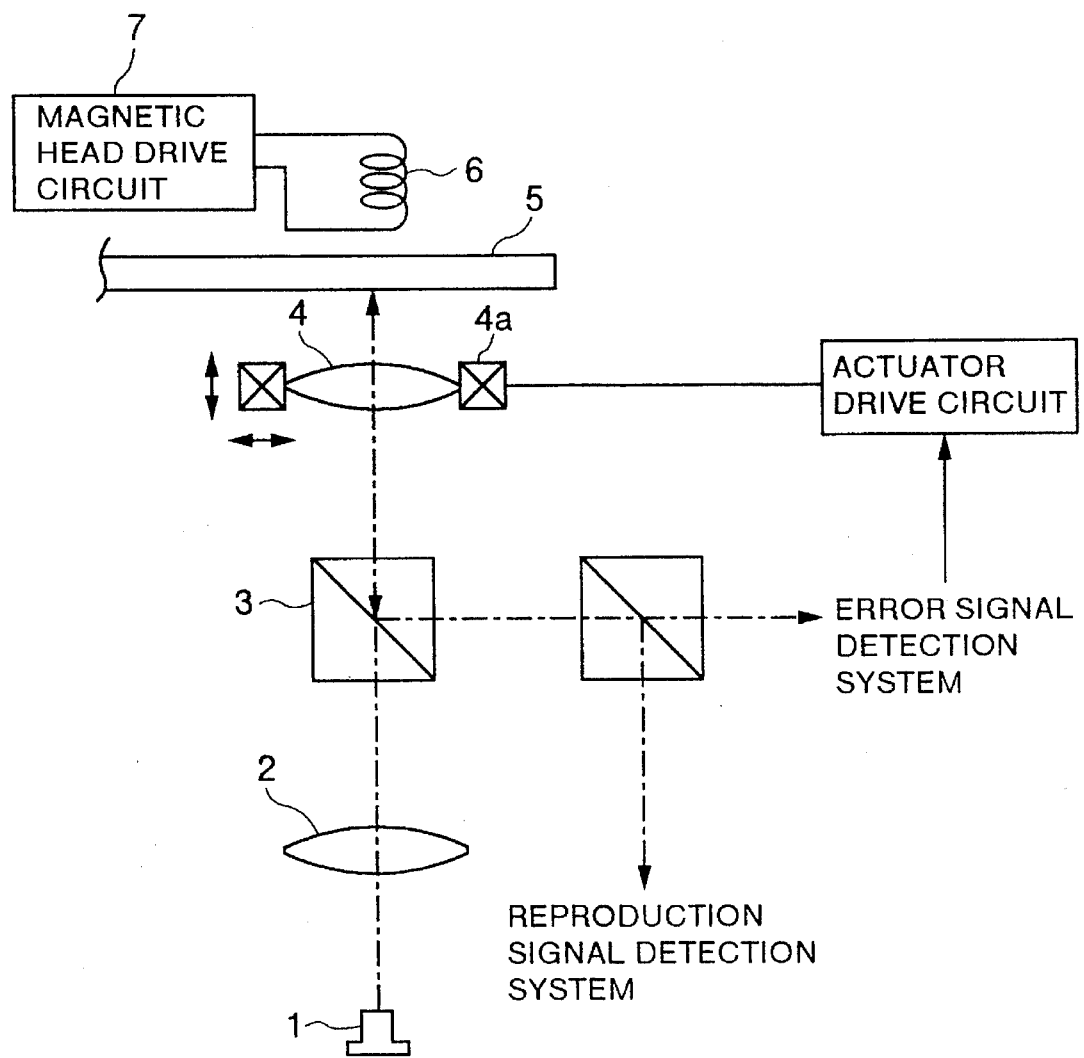
FIG. 1 is a block diagram of an arrangement of a prior art magnetic recording system in which a magneto-optical disk is used.
Figure 2A:
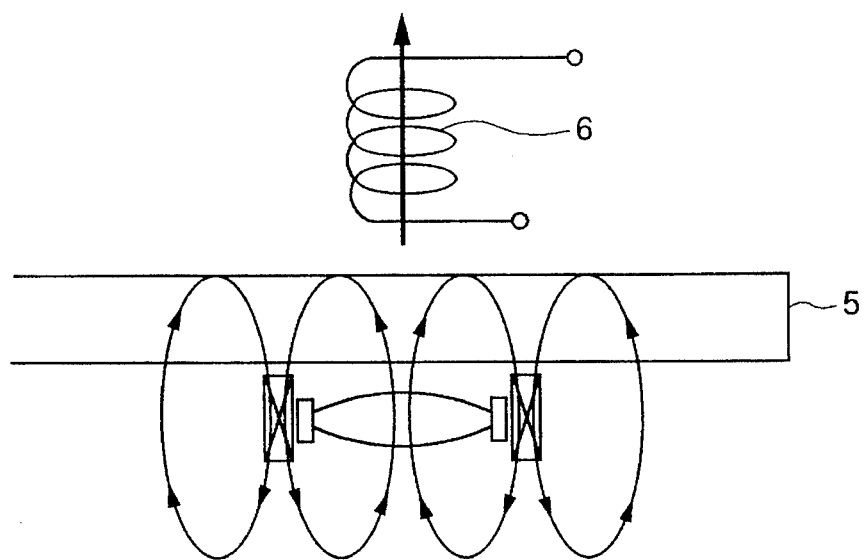
FIG. 2A is a diagram for explaining the influences of external magnetic field caused by a magnetic circuit of a focusing/tracking actuator on a magnetic recording medium, together with an electro-magnetic transducer illustrated as excited in one direction.
Figure 2B:
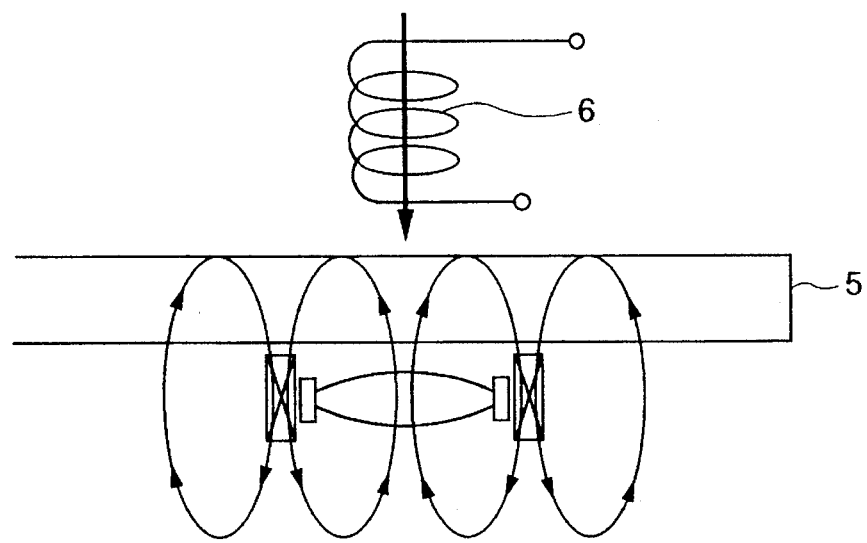
FIG. 2B is a diagram for explaining the influences of external magnetic field, together with the electro-magnetic transducer illustrated as excited in the other direction.
Figure 2C:
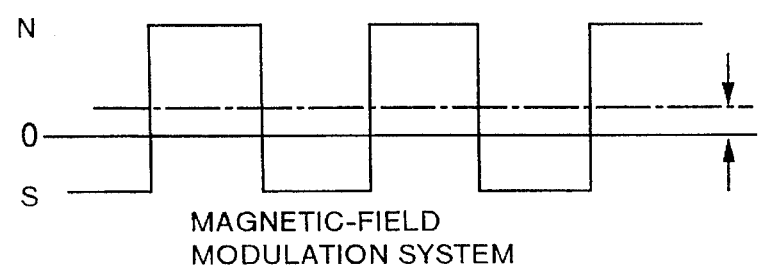
FIG. 2C shows a waveform of a variation in a magnetic field applied to the magnetic recording medium in the prior art magnetic recording system.
Figure 3:
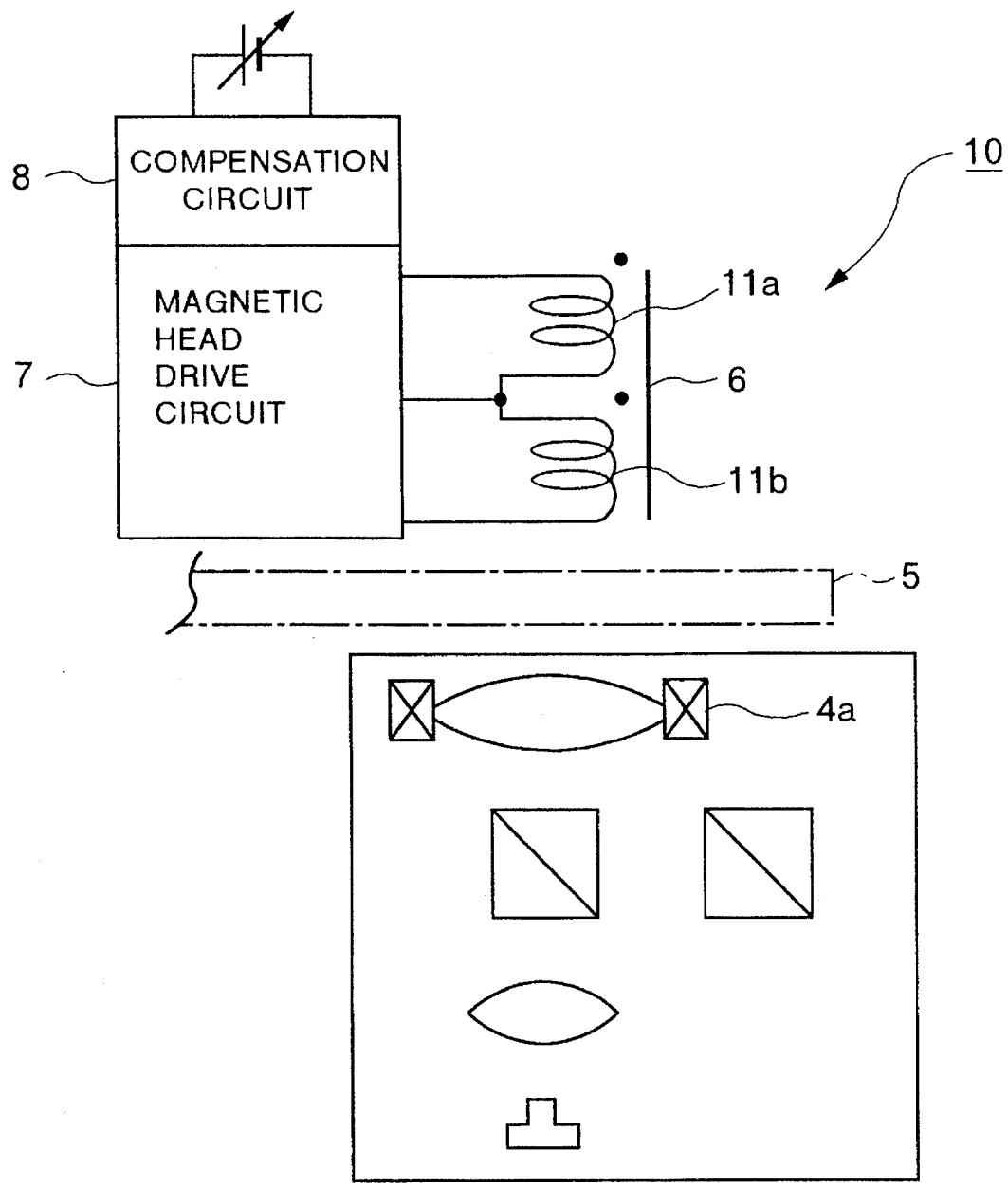
FIG. 3 is a block diagram of a magnetic recording system in accordance with the present invention which is applied to a bi-filar winding type electro-magnetic transducer.

Referring first to FIG. 3, there is shown a magneto-optical disk system 10 in accordance with an embodiment of the present invention, which includes an electro-magnetic transducer 6 of a bi-filar winding type having two coils 11a and 11b and wherein an electric current is passed through one of the 2 coils so that the magnetic head controls a magnetic field to be applied to a magnetic recording medium 5. A magnetic head drive circuit 7 for driving the magnetic head 6 is connected with an adjustable compensation circuit 8 for canceling a leakage magnetic field generated by a focusing/tracking actuator 4a. The invention will be further described in connection with the following embodiments.

Figure 4A:
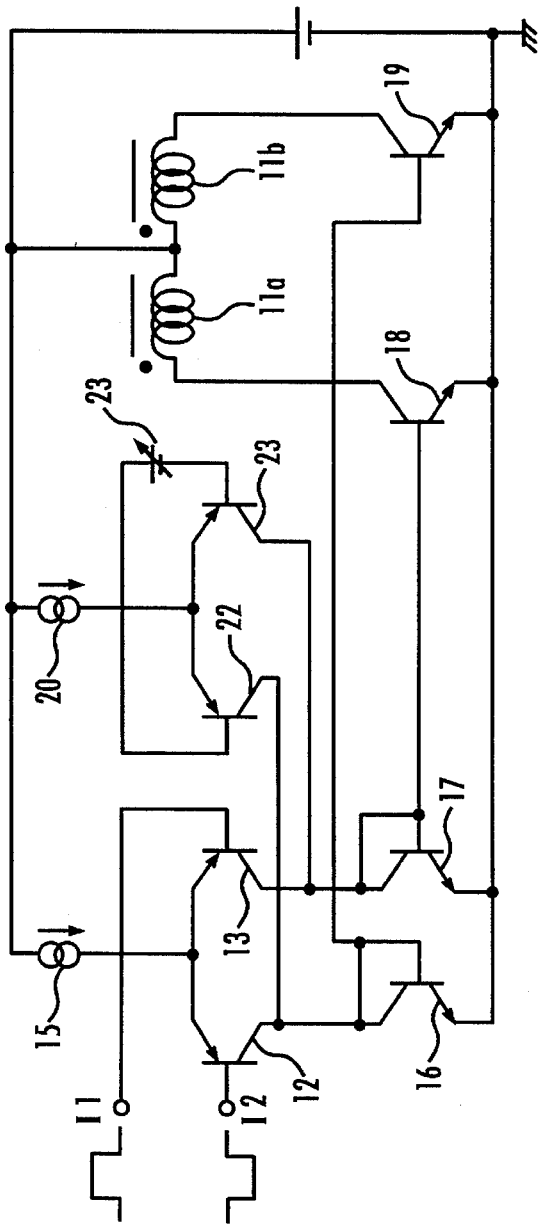
FIG. 4A is a circuit diagram of a magnetic head drive circuit in a first embodiment of the present invention applied to the bi-filar winding type electro-magnetic transducer.

FIG. 4A is a first example of the magnetic head drive circuit used in the magneto-optical disk system of the present invention. The present magnetic head drive circuit is a drive circuit for receiving data from its input terminal I1 and inverted data from its input terminal I2 to drive the electro-magnetic transducer of the bi-filar winding type. The coils 11a and 11b are wound around the core of the electro-magnetic transducer to control a magnetic field established by the core.

The input terminal I1 and the inverted input terminal I2 are connected to the bases of transistors 12 and 13 which form a differential pair so that an electric current from a constant electric current source 15 flows selectively through the transistor 16 or 17 in accordance with the input data received from the input terminals I1 and I2. For example, when the input signal received from the input terminal I1 has a low (L) level and the input signal received from the inverted input terminal I2 has a high (H) level, the transistor 13 is conducted and the transistor 12 is put in its cut-off state, which results in that the electric current from the constant electric current source 15 flow into the transistor 17 via the transistor 13. The collector of the transistor 17 is connected to its own base and also to the base of a transistor 18 to form an electric current mirror circuit therewith. When the transistor 17 is switched on, this causes the transistor 18 to be switched on so that the electric current flows into the coil 11a connected in series with the collector of the transistor 18. On the contrary, when the input signal from the input terminal I1 has a level "H" and the input signal from the inverted input terminal I2 has a level of "L", the transistor 12 is switched on and the transistor 13 is turned off, so that the electric current of the constant electric current source 15 flows in the transistor 16. The transistor 16 forms an electric current mirror circuit together with a transistor 19. Thus, conduction of the transistor 16 causes the transistor 19 to be switched on so that the electric current flows into the coil 11b connected in series with the collector of the transistor 19. The constant electric current source 20, a variable power source 21, and transistors 22 and 23 form the aforementioned compensation circuit which is connected to the collectors of the transistors 12 and 13.

Assume in the present example that the variable voltage source 21, disposed between the base of transistor 22 and the base of transistor 23, has an output voltage of $V_{21}$, the transistors 22 and 23 have collector electric currents of $I_{C22}$ and $I_{23}$, respectively, and the constant electric current source 20 wired to the emitters of the transistors 22 and 23 has an output electric current of $I_{20}$. Then the following relationships are satisfied.

$$I_{C22} - I_{C23} = f(V_{21})$$

$$I_{C22} + I_{C23} = I_{C20}$$

Figure 4B:
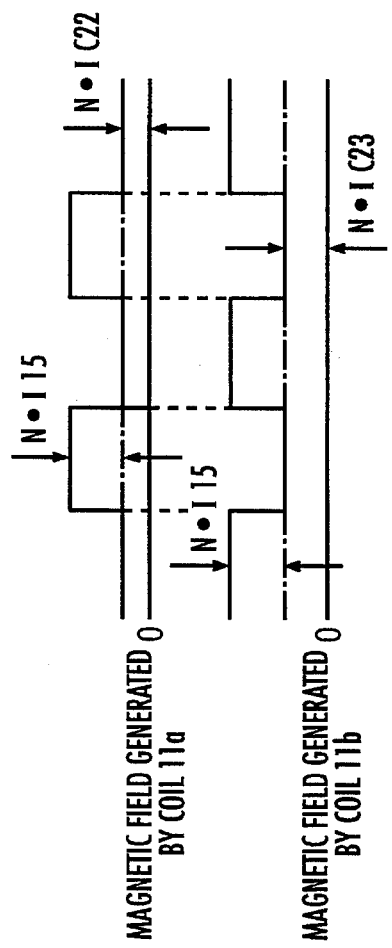
FIG. 4B shows waveforms of variations in electric currents applied to an electro-magnetic transducer in the first embodiment of the present invention.

When $V_{21}=0$, a relationship $I_{C22}=I_{C22}$ is satisfied. When the value of $V_{21}$ is adjusted, a predetermined difference takes place between the $I_{C22}$ and $I_{C23}$. The difference between the $I_{C22}$ and $I_{C23}$ causes a difference in collector electric current to take place between the transistors 18 and 19, with the result that a difference occurs between the electric currents flowing into the coils 11a and 11b. The electric currents flowing into the coils derives different offset magnetic fields $N \cdot I_{C22}$ and $N \cdot I_{C23}$, as shown in FIG. 4B. In FIG. 4B, a difference or offset (between the $I_{C22}$ and $I_{C23}$) corresponds to a compensation. In the drawing, reference symbol N denotes an electric current amplification factor of the transistors 18 and 19 and symbol $I_{15}$ denotes the electric current value of the constant electric current source 15.

Figure 5A:
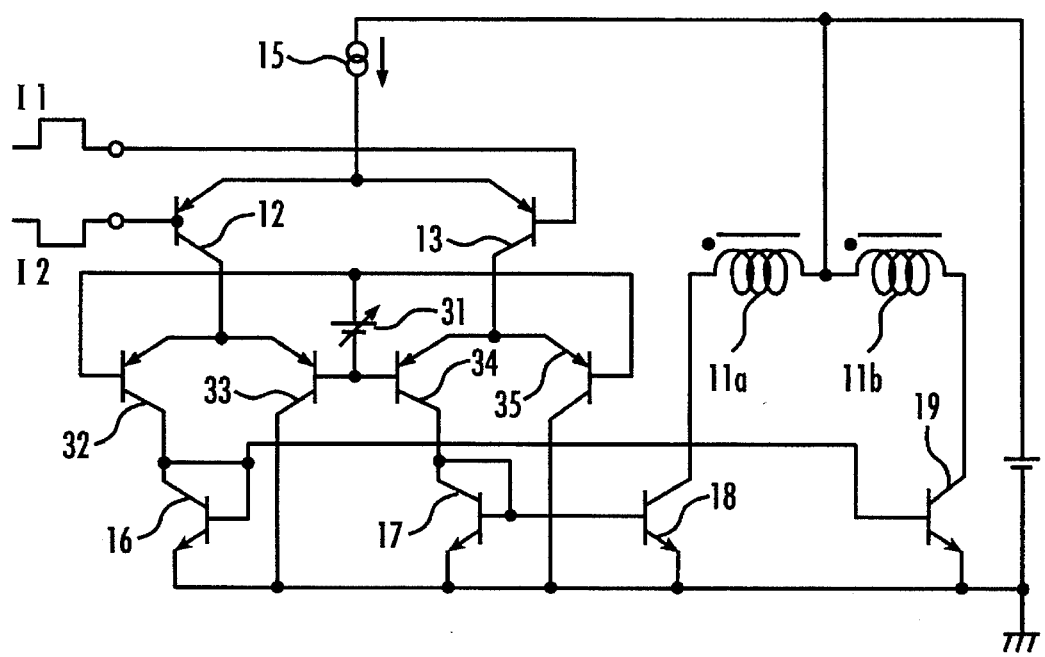
FIG. 5A is a circuit diagram of a magnetic head drive circuit in a second embodiment of the present invention applied to the bi-filar winding type electro-magnetic transducer of the present invention.

Shown in FIG. 5A is a second example of the magnetic head drive circuit of the bi-filar winding type used in the magnetic recording system of the present invention. The magnetic head drive circuit comprises a twin differential circuit having three differential pairs. More specifically, a variable voltage source 31 and transistors 32 or 35 form a compensation circuit. The drive circuit is arranged so that the compensation circuit divides an electric current received from a constant electric current source 15 into divided electric currents with a suitable ratio, and supplies the divided electric currents to the transistors 16 and 17 to cause a difference between the electric currents flowing into the coils 11a and 11b. Assuming that the transistors 32 to 35 have emitter electric currents of $I_{C32}$, $I_{C33}$, $I_{C34}$, and $I_{C35}$ in their conduction state, then relationships of $I_{C32}=I_{C35}$ and $I_{C33}=I_{C34}$ are satisfied, because the transistors 32 and 35 are connected commonly at their bases and the transistors 33 and 34 are connected commonly at their bases. However, since a variable power source 31 is provided between the bases of the transistors 33 and 34 and the bases of the transistors 32 and 35, a relationship of $I_{C32} \neq I_{C34}$ is satisfied. The difference between the electric currents $I_{C32}$ and $I_{C34}$ corresponds to an electric current difference between the transistors 16 and 17 and this, when the transistors 18 and 19 are switched on, causes a difference to take place between the electric currents flowing into the coils 11a and 11b.

Figure 5B:
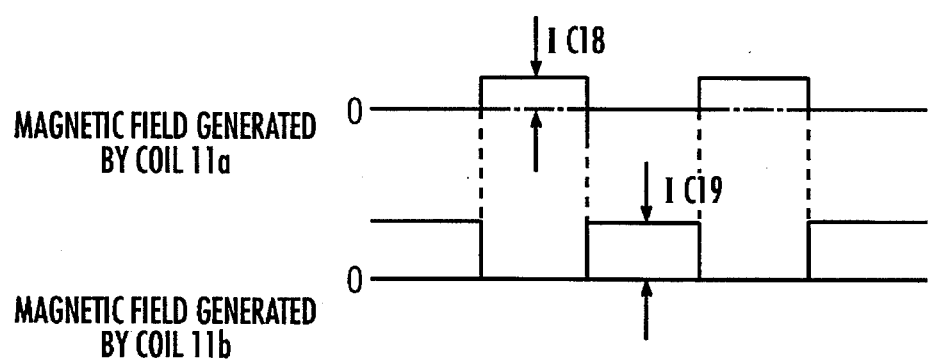
FIG. 5B shows waveforms of variations in electric currents applied to an electro-magnetic transducer in the second embodiment of the present invention.

When an input signal having a level "L" is applied to the input terminal I1, this causes the transistors 13, 34 and 17 to be switched on, thus resulting in that the transistor 18 forming an electric current mirror circuit together with the transistor 17 is conducted so that the electric current $I_{C18}$ flows into the coil 11a. On the other hand, a level "H" is applied to the input terminal I2 resulting in that the electric current $I_{C19}$ flows into the coil 11b. Therefore, as described above, a difference is caused between the electric currents flowing into the coils 11a and 11b, which electric current state is shown in FIG. 5B. A difference in electric current peaks in FIG. 5B causes the undesired magnetic field extended to the magnetic recording medium to be always compensated for.

Figure 6:
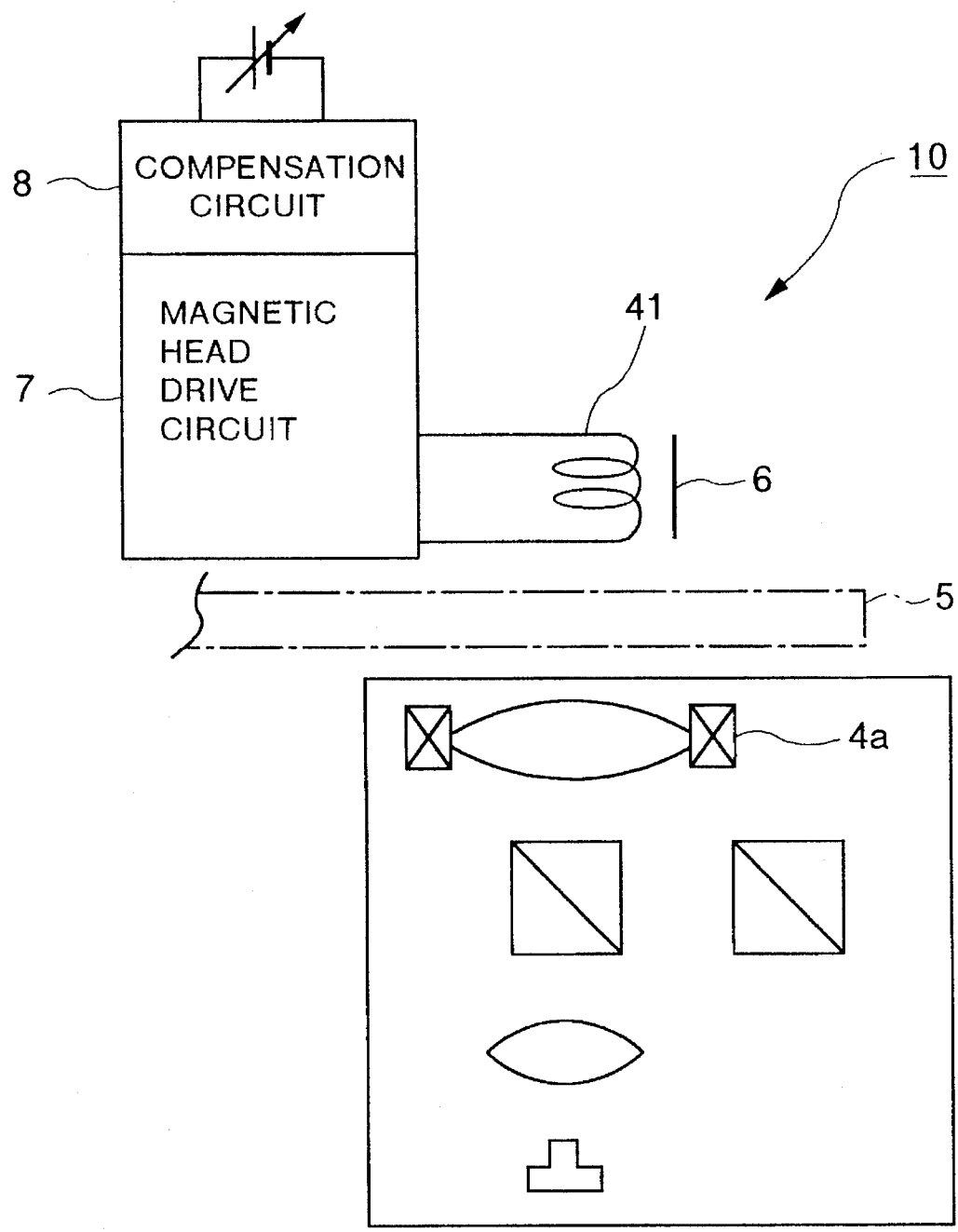
FIG. 6 shows a block diagram of a magnetic recording system in accordance with the present invention which is applied to a mon-filar winding type electro-magnetic transducer.

FIG. 6 shows a magneto-optical disk system as an example applied with the present invention which has a magnetic head of mono-filar type including a single coil 41 and for controlling a magnetic field applied to a magnetic recording medium according to the direction of electric current flowing through the coil 41.

Figure 7:
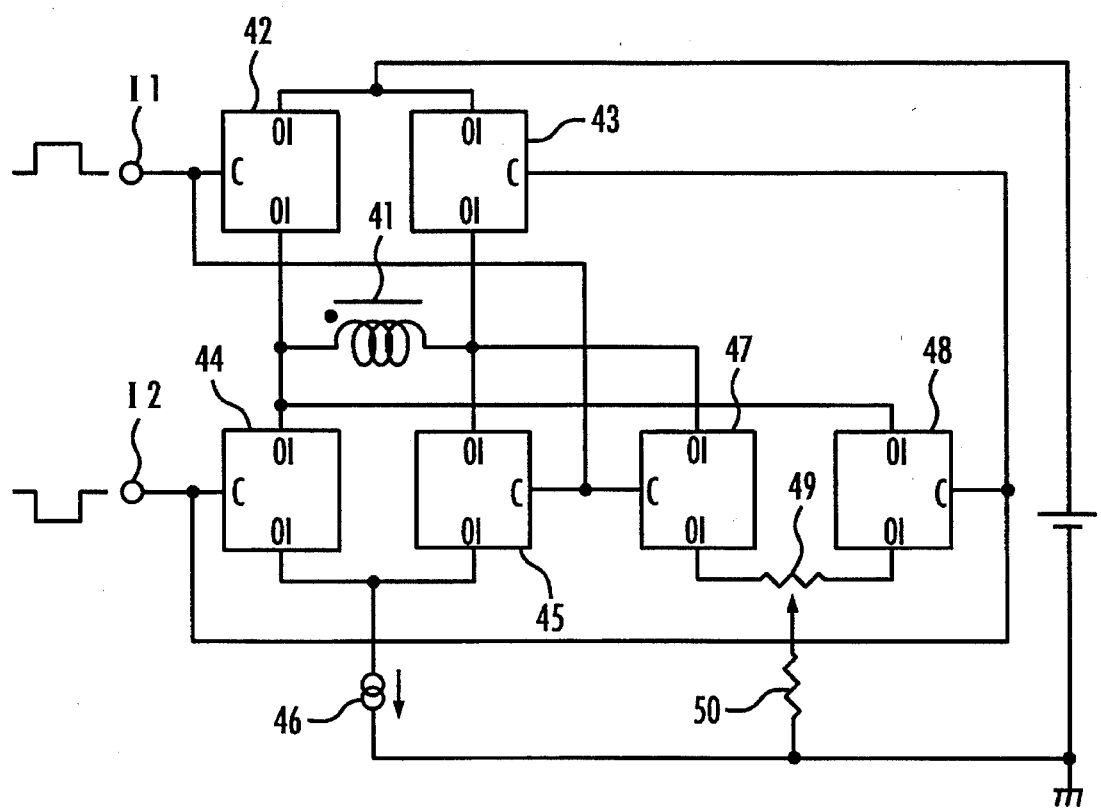
FIG. 7 is a circuit diagram of a magnetic head drive circuit in a third embodiment of the present invention applied to the mono-filar winding type electro-magnetic transducer.

FIG. 7 shows a magnetic head drive circuit of a mono-filar winding type used in a magnetic recording system of a third embodiment of the present invention. Supplied to a magnetic head coil 41 is a drive electric current selectively in a direction from left to right or vice versa (in the drawing) through four switching elements 42 to 45. The switching elements 42 to 45 are analog switching elements which are electrically open- or closed-circuited so that, only when a positive pulse is applied to a terminal C, a closed-circuit is established between two terminals OI. A constant electric current source 46 is provided at a suitable position in the magnetic head drive circuit to limit the electric current to a set value flowing through the switching element 44 or 45, for example. Further, a junction between the switching elements 42 and 44 is grounded through a similar switching element 48, a part of variable resistor 49 and a resistor 50 in a relationship parallel to the switching element 44 and the constant electric current source 46, whereas a junction between the switching elements 43 and 45 is grounded through a switching element 47, the complementary part of the variable resistor 49 and the resistor 50 in a relationship parallel to the switching element 45 and the constant electric current source 46.

When a positive pulse having a level "H" is applied to the input terminal I1 for example, this causes the switching elements 42 and 45 to be closed between their terminals OI so that an electric current flows through the coil 41 from the left side t to the right in the drawing. At the same time, the switching element 47 is closed-circuited or returned ON so that the electric current flows into ground via the left part (in the drawing) of the variable resistor 49 and the resistor 50. When a signal with a level "H" is applied to the input terminal I2, an electric current flows through the coil 41 from the right side to the left as opposed to the above. At the same time, the switching element 48 is closed between the terminals OI, so that the electric current flows into ground through the right part of the variable resistor 49 and the resistor 50. That is, the present embodiment is arranged so that a total resistance value of a circuit path from the coil 41 via the switching element 47, variable resistor 49 and resistor 50 to ground is set to be different from a total resistance value of a circuit path from the coil 41 via the switching element 48, variable resistor 49 and resistor 50 to ground. Therefore, the value of the electric current flowing through the coil 41 added to the electric current from the constant electric current source 46 is varied whereby a bias is applied to a magnetic field generated by the electro-magnetic transducer to compensate for the influences of an external magnetic field.

Figure 8:
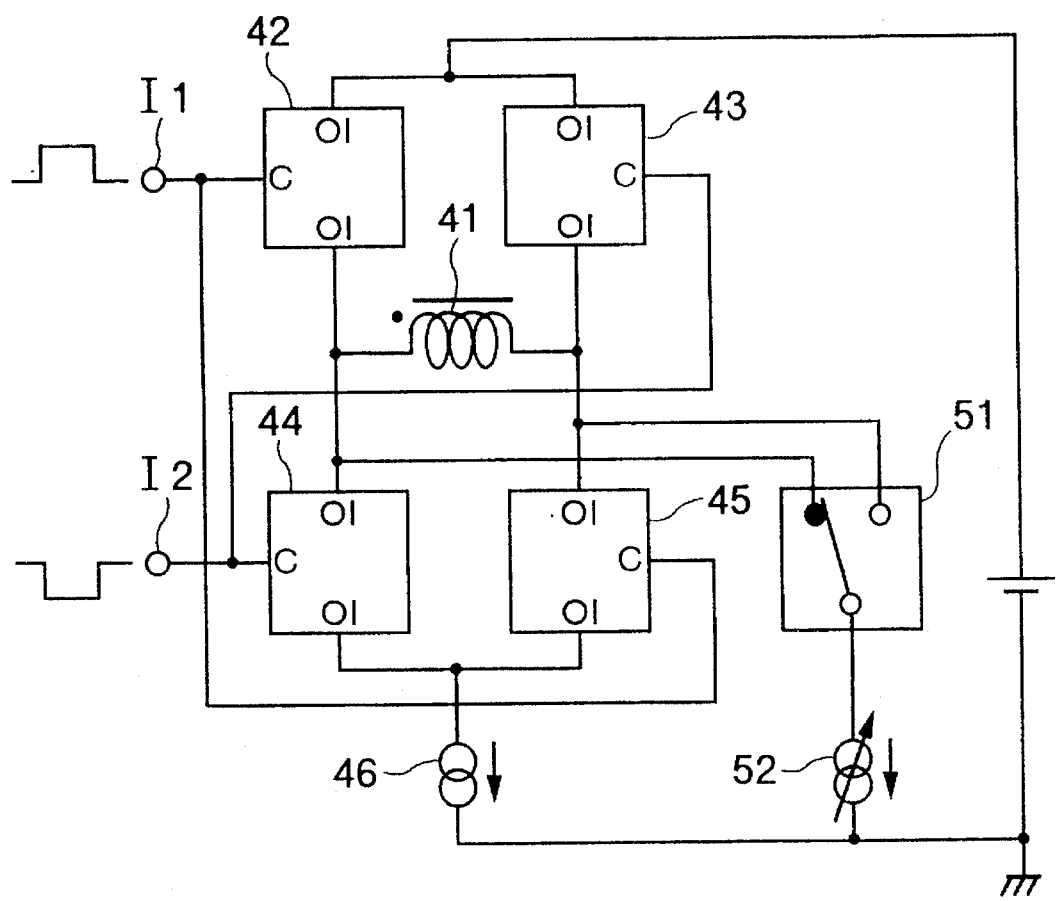
FIG. 8 is a circuit diagram of a magnetic head drive circuit in a fourth embodiment of the present invention applied to the mono-filar winding type magnetic head.

There is shown in FIG. 8 a fourth example of the magnetic head drive circuit of the mono-filar winding type used in the magnetic recording system of the present invention. In the present magnetic head drive circuit, a change-over switch 51 which is electrically, mechanically or optically controllable is provided for determining the direction of the current and a variable electric current source 52 is provided for setting the value of the electric current at a desired level. Application of a signal with a level "H" to the input terminal I1 causes switching elements 42 and 45 be closed so that an electric current flows through the coil 41 from its left side to the right in the drawing. At the same time, if the switch 51 is closed as connected to the switching element 45, then an excess electric current corresponding to a set electric current value of the variable electric current source 52 flows to thereby compensate for the influences of external magnetic field. Application of a signal with a level "H" to the input terminal I2 causes an electric current to flow through the coil 41 in the other direction as opposed to the above.

Although the present invention has been used for the purpose of eliminating the influences of external magnetic field in the magneto-optical disk system, the present invention is not limited to the specific purpose. For example, for the purpose of eliminating the influences of leakage magnetic field of an actuator on the magnetic field generated by a magnetic head which would often occur in a usual flexible disk device, the present invention may be easily applied. Further, the present invention can be applied to any systems so long as the system uses magnetic writing/reading operations.

As will be clear from the explanation disclosed in the foregoing, in accordance with the magnetic recording system of the present invention, since the electric current corresponding to the magnetic field to be generated by the magnetic head is changed to compensate for the influences of external magnetic field generated by another actuator, etc., the influences of the external magnetic field on the recording medium can be removed, whereby a system recording characteristic can be improved and a system reliability can be increased. Further, since no magnetic shields and no compensation coils are provided, the weight of the actuator for the magnetic head can be decreased. Furthermore, since the magnetic field of the actuator can be set at a fairly high level, a system response performance can also be improved.

What is claimed is:

1. A magnetic recording system comprising:

a magnetic head including an electro-magnetic transducer having at least one coil for applying a magnetic field for recording/erasing of data with respect to a recording medium; and a magnetic head drive circuit having means for supplying a processing electric current to said at least one coil for applying said magnetic field, and having means for generating a compensation direct electric current and means for adding said compensation direct electric current to said processing electric current, said compensation direct current having an amplitude so as to cause said at least one coil to generate a bias magnetic field for eliminating an undesirable leakage magnetic field applied on said recording medium other than said processing magnetic field necessitated for recording/erasing of data.

2. A magnetic recording system as set forth in claim 1, wherein said recording medium is a magneto-optical disk, said magnetic recording system is a magneto-optical disk system of a magnetic-field modulation type in which said magnetic recording system further includes an optical pickup head for irradiating a laser beam onto a micro area on said magneto-optical disk, and said magnetic head applies the recording/erasing magnetic field to said micro area.

3. A magnetic recording system comprising:

a magnetic head for generating a magnetic field for recording of data in a magnetic recording medium and for erasing of data from the magnetic recording medium; and magnetic-field generation means for supplying an electric current to cause the magnetic head to generate the magnetic field, and having means for supplying a compensation electric current with an amplitude and a bias to the magnetic head, said amplitude and bias corresponding to the direction of the electric current flow on said coil and the selection of coils on the magnetic head, so as to cause generation of said magnetic field to cancel a leakage magnetic field applied to said magnetic recording medium.

4. A magnetic recording system for use of a magneto-optical disk as set forth in claim 3, further comprising:

a movable laser beam irradiation means for generating a laser beam and irradiating the laser beam onto the magneto-optical disk;

a first actuator magnetically driven to drive said magnetic head;

a second actuator magnetically driven to translationally move said laser beam irradiation means; and a third actuator magnetically driven to move said laser beam irradiation means in a focusing and tracking operation on said magneto-optical disk, wherein said compensation circuit cancels the leakage magnetic field caused by at least one of said first, second and third actuators.

5. A magnetic recording system as set forth in claim 1, wherein said processing electric current is a modulated electric current, and wherein said magnetic head comprises a bi-filar winding type electro-magnetic transducer having two coils and having a means for selectably connecting said two coils to said magnetic head drive circuit so as to generate a summation of recording/erasing magnetic fields controlled by a modulated electric current and biased magnetic field by direct electric currents and said compensation circuit generates different intensity of direct electric currents to the magnetic head according to a selection of the coils.

6. A magnetic recording system as set forth in claim 1, wherein said magnetic head comprises a mon-filar winding type electro-magnetic transducer having a single coil which generates summation of recording/erasing magnetic field controlled by a modulated electric current and biased magnetic field by direct electric current, and said means for generating a compensation direct current generates an intensity of direct electric currents to the magnetic head according to a direction of the electric currents flowing through said coil.

7. A magnetic recording system as set forth in claim 3, wherein said magnetic head comprises a bi-filar winding type electro-magnetic transducer having two coils and means for selectably connecting said two coils to an electric current, so as to generate a compensation of external leakage magnetic field controlled by a modulated electric current and biased magnetic field by direct electric current, said magnetic head drive circuit has means for generating a processing electric current having an amplitude and a bias to said magnetic head according to selection of the coils.

8. A magnetic recording system as set forth in claim 3, wherein said magnetic head comprises a mono-filar winding type electro-magnetic transducer having a single coil which generates a compensation of external leakage magnetic field as the modulated magnetic field for recording and erasing is biased by the processing electric current, and said magnetic head drive circuit including said compensation electric circuit generates a different amplitude and a different bias of said processing electric current to the magnetic head according to a direction of the electric current flowing through said coil.

* * * * *